United States Patent [19]

Amanai

[11] Patent Number: 5,787,037
[45] Date of Patent: Jul. 28, 1998

[54] NON-VOLATILE MEMORY DEVICE WHICH SUPPLIES ERASABLE VOLTAGE TO A FLASH MEMORY CELL

[75] Inventor: Masakazu Amanai, Tokyo, Japan

[73] Assignee: NEC Corporation, Tokyo, Japan

[21] Appl. No.: 853,675

[22] Filed: May 9, 1997

[30] Foreign Application Priority Data

May 10, 1996 [JP] Japan ............... 8-115910

[51] Int. Cl.$^6$ ............... G11C 11/34
[52] U.S. Cl. ............... 365/185.18; 365/185.23; 365/185.29; 365/185.33; 365/218
[58] Field of Search ............... 365/185.18, 185.23, 365/185.24, 185.26, 185.29, 185.33, 218

[56] References Cited

U.S. PATENT DOCUMENTS

| | | | |
|---|---|---|---|
| 5,357,465 | 10/1994 | Challa | 365/185.18 |
| 5,559,736 | 9/1996 | Matsukawa et al. | 365/185.29 |
| 5,598,369 | 1/1997 | Chen et al. | 365/185.29 |

FOREIGN PATENT DOCUMENTS 6-168597  6/1994  Japan.

*Primary Examiner*—David C. Nelms
*Assistant Examiner*—Trong Phan
*Attorney, Agent, or Firm*—Whitham, Curtis & Whitham

[57] ABSTRACT

In a nonvolatile semiconductor memory device comprising an address driving section comprising an N-channel transistor (11) and a P-channel transistor (12) and a memory cell (15) for erasing stored contents therefrom by supplying a control gate (CG) with a predetermined voltage, a negative voltage generation circuit (25) supplies a negative voltage to one of source and drain of the N-channel transistor (11) on erasing the stored contents in order to supply the negative voltage to the control gate (CG) of the memory cell (15) via the N-channel transistor (11), thereby erasing the stored contents from the memory cell (15). On writing data in the memory cell (15), a positive voltage generation circuit (30) supplies the control gate (CG) of the memory cell (15) with a higher voltage than an output voltage of an address driving section (10, 11, 12) in place of the output voltage of the address driving section.

9 Claims, 7 Drawing Sheets

NON-VOLATILE MEMORY DEVICE WHICH SUPPLIES ERASABLE VOLTAGE TO A FLASH MEMORY CELL

BACKGROUND OF THE INVENTION

This invention relates to a nonvolatile semiconductor memory device including a memory cell which is capable of electrically erasing stored contents therefrom.

In general, the nonvolatile semiconductor memory device of the type described comprises a plurality of memory cells which are arranged in row and column directions. In this event, as each memory cell is used a cell which enables not only writing and reading of information but also electrical erasing of information. Such a cell is hereinunder called a flash memory cell.

Such a flash memory cell usually comprises a semiconductor substrate of a first conductivity type, drain and source regions formed in the semiconductor substrate with a channel region put therebetween, a floating gate formed on the channel region via a gate insulating film, and a control gate formed on the floating gate via an insulating film. The nonvolatile semiconductor memory device using the flash memory cells normally has a structure so that the drains of the flash memory cells are connected to bit lines extending in the column direction while the control gates of the flash memory cells are connected to word lines extending in the row direction.

In addition, each bit line is connected to a column row decoder for selecting one of the bit lines extending the column direction which each word line is connected to a row decoder for selecting one of the word lines extending in the row direction.

In the nonvolatile semiconductor memory device having the above-mentioned structure, it is necessary to supply the drain and the source regions and the control gate with voltages which are different from one another on write-in, read-out, and erasing operations.

Description will proceed to a general operation of the flash memory cell. On the write-in operation, the source region of a selected flash memory cell is supplied with zero potential while the drain region and the control gate are supplied with voltages of about 6 volts and 12 volts, respectively. Thereby, charges are injected from the drain region to the floating gate to accumulate the charges in the floating gate and then writing of information is carried out. In addition, on the read-out operation, the source region of the selected flash memory cell is held the zero potential while the drain region and the control gate are supplied with the voltages of about 1 volt and about 5 volts, respectively. Thereby, reading of information is carried out by detecting current which varies according to the charges accumulated in the floating gate.

Furthermore, on the erasing operation, the drain region of the selected flash memory cell is put into open state, the source region is supplied with the voltage of about 10 volts, and the control gate is supplied with the voltage of about 8 volts. Thereby, erasing of information is carried out by discharging the charges from the floating gate.

As described above, in a case of selection of the word line, the control gate of the flash memory cell connected to the word line is supplied with positive voltages which are different from one another on the write-in, the read-out, and the erasing operations. As a result, the word line is connected to a positive voltage generation circuit for generating a plurality of positive voltages.

On the other hand, in the nonvolatile semi-conductor memory device of the type described, it is needed to miniaturize each flash memory cell. As a result, an attempt to make the voltages supplied to the source region, the drain region, and the control gate lower is made. Specifically, a memory cell, which makes a relative potential difference between the voltage in the source region and the voltage in the control gate about 8 volts on the erasing operation, is proposed.

By using such a memory cell, it is considered that the potential difference between the source and the control gate is taken as about 8 volts by making the voltage of the source region 7.5 volts and by making the voltage of the control gate −0.5 volts. However, in order to supply the negative voltage, it is necessary for the nonvolatile semiconductor memory device to be equipped with a negative voltage generation circuit as well as the positive voltage generation circuit and structure of the circuit is extremely complicated. Therefore, the fact is that a specific circuit structure for carrying out the erasing operation by a low negative voltage using the above-mentioned memory cell is not proposed.

Japanese Unexamined Patent Publication of Tokkai No. Hei 6-168,597 or JPA 6-168,597 discloses a flash memory which drives the word line with variable voltages on the read-out, the write-in, and the erasing operations. In the flash memory according to JPA 6-168,597, on the write-in operation, a selected word line is supplied with a higher voltage than a power-supply voltage on the read-out operation. The word line is supplied with a negative voltage on the erasing operation. Selection of the word line is made by selecting an address via a level shifter on the read-out operation as well as the write-in and the erasing operations. As a result, delay in a signal occurs due to the level shifter. In addition, penetration current flows into the level shifter on changing of input. Furthermore, it is necessary for the flash memory according to JPA 6-168,597 to supply an address decoder section with a high voltage as the power-supply voltage on the write-in operation.

Furthermore, in the flash memory of the type describe, an overerasing occurs in the manner which will later be described. In order to prevent occurrence of the overerasing, a following operation is carried out. That is, information is erased from all memory cells after information is written in all memory cells. However, such a operation is more complicated and takes more long time when the flash memory is integrated as higher density.

SUMMARY OF THE INVENTION

It is therefore an object of this invention to provide a nonvolatile semiconductor memory device which is capable of supplying an erasable voltage to a flash memory cell with simple structure on erasing operation.

It is another object of this invention to provide a nonvolatile semiconductor memory device of the type described, which is capable of omitting insertion of a P-channel transistor between a row driving section and a word line.

It is still another object of this invention to provide a nonvolatile semiconductor memory device of the type described, which is capable of selecting a word line at a high speed on read-out operation.

It is yet another object of this invention to provide a nonvolatile semiconductor memory device of the type described, which is capable of omitting supply of a high voltage to an address decoder.

It is a further object of this invention to provide a nonvolatile semiconductor memory device of the type described, which is capable of reading correct information although an overerasing occurs.

Other objects of this invention will become clear as the description proceeds.

According to an aspect of this invention, a nonvolatile semiconductor memory device comprises an address driving section comprising an N-channel transistor and a P-channel transistor. The address driving section produces a level signal corresponding to an address decoded signal. A memory cell has a control gate and erases stored contents therefrom by supplying the control gate with a predetermined voltage. The nonvolatile semiconductor memory device comprises means, on writing data in the memory cell, for supplying the control gate of the memory cell with a higher voltage than an output voltage of the address driving section in place of the output voltage of the address driving section. On erasing the stored contents, a negative voltage generation circuit supplies a negative voltage to a source of the N-channel transistor to supply the negative voltage to the control gate of the memory cell via the N-channel transistor. Thereby, the stored contents are erased from the memory cell.

According to another aspect of this invention, a nonvolatile semiconductor memory device comprises an address driving section comprising transistors having channels which are different from each other and a memory cell having a control gate. The memory cell erases stored contents therefrom by supplying the control gate with a predetermined voltage. The nonvolatile semiconductor memory device comprises a voltage generation circuit, on erasing stored contents from the memory cell, for supplying a forward voltage to a part of p-n junction included in one of the transistors in the address driving section.

According to still another aspect of this invention, a nonvolatile semiconductor memory device comprises a plurality of memory cells each of which has a control gate and an electrode connected to a common line. The memory cells have individual threshold values. The nonvolatile semiconductor memory device comprises voltage supply means for supplying the control gate of each of the memory cells with a negative voltage which is lower than a range in variation of the threshold values of the memory cells. Thereby, it is possible to prevent error of readout caused by overerasing in the plurality of memory cells by supplying the negative voltage to the control gates of nonselected memory cells on read-out operation.

According to yet another aspect of this invention, a nonvolatile semiconductor memory device comprises an address driving section which comprises a single N-channel transistor and a single P-channel transistor having a drain connected to a drain of the N-channel transistor. The address driving section produces a level signal corresponding to an address decoded signal from a common connection node of the both transistors. A memory cell has a control gate and erases stored contents therefrom by supplying the control gate with a predetermined voltage. The nonvolatile semiconductor memory device comprises a negative voltage generation circuit, on erasing the stored contents, for supplying a negative voltage to a source of the N-channel transistor to supply the negative voltage to the control gate of the memory cell via the N-channel transistor. Thereby, the stored contents are erases from the memory cell.

DESCRIPTION OF THE PREFERRED EMBODIMENTS

Figure 1:
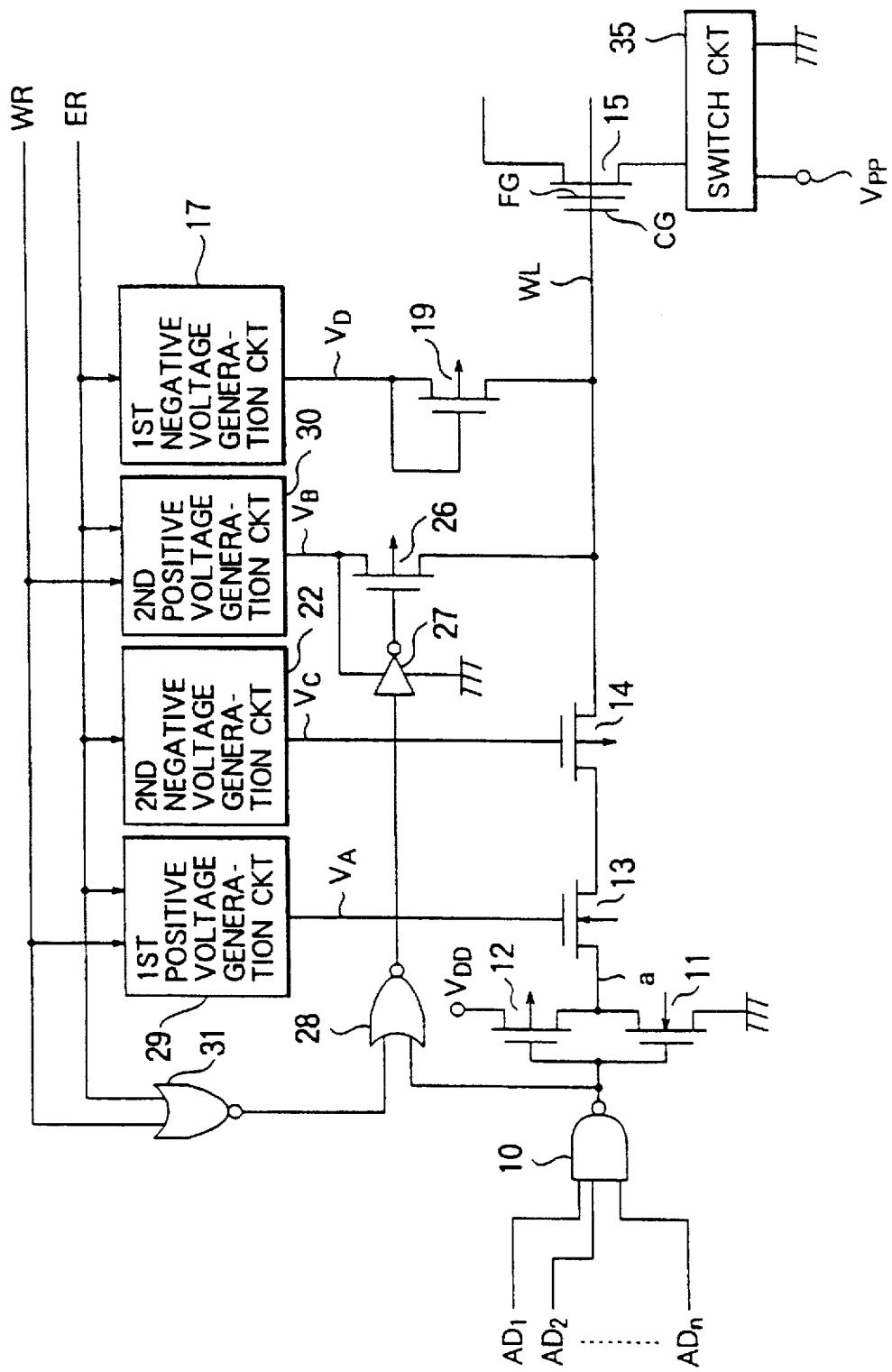
FIG. 1 is a schematic block diagram of a conventional nonvolatile semiconductor memory device.

Referring to FIG. 1, a nonvolatile semiconductor memory device will at first be described in order to facilitate an understanding the present invention. The illustrated nonvolatile semiconductor memory device is a memory device which is capable of erasing stored contents from memory cells by applying a relatively low negative voltage of about −1.5 volts. In the illustrated circuit, although a large negative voltage of about −10 volts is actually applied to the memory cells on an erasing operation, description will be made supposition that the negative voltage of about −1.5 volts is applied to the memory cells in order to facilitate an understanding the present invention.

In FIG. 1, the illustrated nonvolatile semiconductor memory device comprises a plurality of flash memory cells 15 each of which has a control gate connected to a word line WL. In order to simplify illustration, the plurality of flash memory cells 15 are representatively illustrated by a single flash memory cell in FIG. 1. In addition, although the nonvolatile semiconductor memory device really comprises a plurality of word lines corresponding to different addresses, the plurality of word lines are representatively illustrated by a single word line WL.

At first, first through n-th address signals $AD_1, AD_2, \ldots,$ and $AD_n$ are supplied to a row driving section which will later become clear, where n represents an integer which is not less than two. The row driving section may be called an address driving section. When the flash memory cell 15 in a row direction in question is selected, all of the first through the n-th address signals $AD_1$ to AD have logic "1". When the flash memory cell 15 is not selected, at least one of the first through the n-th address signals $AD_1$ to $AD_n$ has logic "0"

The illustrated nonvolatile semiconductor memory device are supplied with a first mode signal WR indicative of write-in/read-out operation and a second mode signal ER indicative of erasing operation.

The row driving section comprises an NAND gate 10 supplied with the first through the n-th address signals $AD_1$ to $AD_n$, an N-channel transistor 11 and a P-channel transistor 12 which have gate electrodes connected to each other in common. The N-channel transistor 11 has a source region which is grounded and a drain region connected to a drain region of the P-channel transistor 12. The P-channel transistor 12 has a source region connected to a voltage source (not shown) for supplying a main power-supply voltage $V_{DD}$.

The first and the second mode signals WR and ER are supplied not only to a NOR gate 28 via another NOR gate 31 but also to first and second positive voltage generation circuits 29 and 30 and to first and second negative voltage generation circuits 17 and 22. The first and the second positive voltage generation circuits 29 and 30 generate first and second positive voltages $V_A$ and $V_B$, respectively. The first and the second negative voltage generation circuits 17 and 22 generate first and second negative voltages $V_D$ and $V_C$, respectively.

Among the above-mentioned voltages, the first positive voltage $V_A$ is supplied to a gate electrode of an N-channel transistor 13 while the second negative voltage $V_C$ is supplied to a gate electrode of the a P-channel transistor 14.

In addition, the second positive voltage $V_B$ is supplied to a source electrode of a P-channel transistor 26 while the first negative voltage $V_D$, which includes zero volt, is supplied to a source electrode of a P-channel transistor 19. Supplied with the first negative voltage $V_D$, the P-channel transistor 19 has the source electrode and a gate electrode, which are connected to each other in common, and a drain electrode connected to the word line WL. The second positive voltage $V_B$ is supplied to not only the source electrode of the P-channel transistor 26 but also to an inverter 27 which is connected to the NOR gate 28. In the manner which is similar to the P-channel transistor 19, the P-channel transistor 26 has a drain electrode which is connected to word line WL.

The NAND gate 10, the NOR gate 28, and the NOR gate 31 have positive power-supply terminals (not shown) supplied with the main power-supply voltage $V_{DD}$ and negative power-supply terminals (not shown) supplied with a ground potential or zero volt.

In addition, the first positive voltage generation circuit 29, the second positive voltage generation circuit 30, the first negative voltage generation circuit 17, the second negative voltage generation circuit 22, and the NOR gate 31 may be used to other word lines (not shown) corresponding to different addresses. In this event, the first and the second positive voltages $V_A$ and $V_B$, the first and the second negative voltages $V_C$ and $V_D$, and an output of the NOR gate 31 are connected to the other word lines.

Description will proceed to read-out, write-in, and erasing operations in the nonvolatile semiconductor memory device comprising the above-mentioned structure. In the example being illustrated, it will be assumed as follows. The main power-supply voltage $V_{DD}$ is equal to 3.3 volts in order to make the voltage lower. The flash memory cell 15 has a source electrode connected to a switch circuit 35. The switch circuit 35 selects one of a subsidiary power-supply voltage $V_{PP}$ and the ground voltage or zero volt a s a selected voltage to supply the selected voltage to the source electrode of the flash memory cell 15. The subsidiary power-supply voltage $V_{PP}$ is equal to 7.5 volts.

The read-out operation will be at first described. In this event, signals of the logic "0" are supplied as the first and the second mode signals WR and ER. It will be presumed as follows. The first and the second positive voltage generation circuit 29 and 30 generate, as the first and the second positive voltage $V_A$ and $V_B$, voltages each of which is equal to the power supply voltage $V_{DD}$ of 3.3 volts, respectively. The first and the second negative voltage generation circuits 17 and 22 generate, as the first and the second negative voltages $V_D$ and $V_C$, voltages equal to zero volt and to −5 volts, respectively. The source electrode of the flash memory cell 15 is grounded via the switch circuit 35.

Under the circumstances, it will be assumed that the word line WL is put into a nonselected state. In this event, an output of the NAND gate 10 takes the logic "1", the N-channel transistor 11 is turned on and the P-channel transistor 12 is turned off. As a result, the word line WL has a potential of zero volt and the read-out operation is therefore not carried out.

On the other hand, it will be assumed that the word line WL is put into a selected state. In this event, all of the first through the n-th address signals $AD_1$ to $AD_n$ have the logic "1". The NAND gate 10 produces the output of logic "0" which is supplied to the NOR gate 28 and to the common connected gate electrodes of the P-channel and the N-channel transistors 12 and 11. As a result, the main power-supply voltage $V_{DD}$ is supplied to a point a in the word line WL via the P-channel transistor 12 and in turn to the word line WL via the N-channel and the P-channel transistors 13 and 14 which are put into ON state. On the other hand, the P-channel transistors 26 and 19 are put into OFF state. Accordingly, the word line WL is charged up to the main power-supply voltage $V_{DD}$ and the main power-supply voltage $V_{DD}$ is supplied to the control gate electrode CG of the flash memory cell 15. As a result, a readout signal is produced via the drain electrode of the flash memory cell 15.

Next, the write-in operation will be described. In this event, the signal of the logic "1" is given as the first mode signal WR while the signal of the logic "0" is given as the second mode signal ER. Under the circumstances, the first and the second positive voltage generation circuits 29 and 30 generate, as the first and the second positive voltages $V_A$ and $V_B$, voltages of 2 volts and of 7.5 volts, respectively. On the other hand, the first and the second negative voltage generation circuits 17 and 20 generate, as the first and the second negative voltages $V_D$ and $V_C$, voltages of zero volt and of −5 volts, respectively. In addition, the source electrode of the flash memory cell 15 is supplied with the subsidiary power-supply voltage $V_{PP}$ of 7.5 volts via the switch circuit 35.

Inasmuch as the first mode signal WR of logic "1" and the second mode signal ER of the logic "0" are given, the P-channel transistor 26 becomes ON state via the NOR gates 31 and 28 and the inverter 27 and the P-channel transistor 19 is put into OFF state.

Under the circumstances, it will be assumed that the word line WL is put into the nonselected state. In this event, the output of the NAND gate 10 takes the logic "1". As a result, the N-channel transistor 11 is turned on in the similar manner in a case of the read-out operation. Accordingly, the potential of the word line WL becomes zero volt.

On the other hand, when the word line WL is selected, all of the first through the n-th address signals $AD_1$ to $AD_n$ become the logic "1" and the output of the NAND gate 10 becomes the logic "0". Therefore, the P-channel transistor 12 becomes the ON state and the main power-supply voltage $V_{DD}$ is supplied at the point a of the word line WL.

In this event, the N-channel transistor 13 is put into OFF state by the first positive voltage VA of 2 volts while the P-channel transistor 14 is put into ON stage by the second negative voltage of −5 volts. In addition, inasmuch as the P-channel transistor 19 is put into OFF state and the P-channel transistor 26 is put into ON state, the second positive voltage $V_B$ of 7.5 volts is supplied on the word line WL from the second positive voltage generation circuit 30.

Finally, erasing operation will be described. In this event, the signal of the logic "0" is given as the first mode signal WR while the signal of the logic "1" is given as the second mode signal ER. In addition, the first and the second positive voltage generation circuit 29 and 30 generate, as the first and the second positive voltages $V_A$ and $V_B$, voltages of zero volt and of 3.3 volts, respectively. It is presumed that the P-channel transistor 19 has an absolute value $|V_{TP}|$ of a threshold voltage $V_{TP}$ that is equal to one volt. Under the circumstances, the first negative voltage generation circuit 17 generates, as the first negative voltage $V_D$, a voltage of −1.5 volts. The second negative voltage generation circuit 22 generates, as the second negative voltage $V_C$, a voltage of zero volt. On the other hand, the source electrode of the flash memory cell 15 is supplied with the subsidiary power-supply voltage $V_{PP}$ of 7.5 volts and the drain electrode of the flash memory cell 15 is put into an open state.

Under the circumstances, it will be assumed that at least one of the first through the n-th address signals $AD_1$ to $AD_n$ has the logic "0". In this event, the N-channel transistors 11 and 13 and the P-channel transistor 14 are turned on and the P-channel transistor 26 is turned off.

In this event, inasmuch as the P-channel transistor 19 is put into ON state, the word line is supplied with a voltage obtained by subtracting the absolute value $|V_{TP}|$ of the threshold voltage $V_{TP}$ of the P-channel transistor 19 from the first negative voltage $V_D$, namely, a potential (−0.5 volts) of ($V_D - |V_{TP}|$). The potential of −0.5 volts is supplied to the control gate electrode CG of the flash memory cell 15.

In the manner which is described above, the source electrode of the flash memory cell 15 is supplied with the subsidiary power-supply voltage V of 7.5 volts, a potential difference between the control gate electrode CG and the source electrode of the flash memory cell 15 becomes 8 volts which can erase stored contents from the flash memory cell 15.

Description is made supposition that the first negative voltage generation circuit 17 generates the low voltage of about −1.5 volts in order to describe that the erasing operation for the flash memory cell 15 can be made by supplying the control gate electrode of the flash memory cell 15 with the low voltage in FIG. 1.

However, the erasing operation for flash memory cell 15 is actually carried out so that the first negative voltage generation circuit 17 generates a comparatively lower voltage of about −10 volts than −1.5 volts. As a result, the first negative voltage generation circuit 17 has a very complicated circuit structure and occupies a wider area in the nonvolatile semiconductor memory device. In addition, the nonvolatile semiconductor memory device illustrated in FIG. 1 is complicated in structure because the first and the second negative voltage generation circuits 17 and 22 are required. Furthermore, the nonvolatile semiconductor memory device illustrated in FIG. 1 is disadvantageous in that it is difficult to comply with demand of the low voltage. This is because it is necessary to make the second negative voltage generation circuit 12 operate during an interval for read-out/write-in and it results in consumption of much current.

In addition, it is necessary for the nonvolatile semiconductor memory device illustrated in FIG. 1 to supply the word line WL with the voltage having an amplitude of the main power-supply voltage $V_{DD}$ or a full amplitude on the write-in operation or the read-out operation other than the erasing operation. As a result, the nonvolatile semiconductor memory device illustrated in FIG. 1 is disadvantageous in not only that the second negative voltage generation circuit 22 must apply a sufficient negative voltage to the gate electrode of the P-channel transistor 14 and but also that insertion of the P-channel transistor results in raising a resistance between the row driving section and the word line and in lengthening a charge time interval for the word line.

Another nonvolatile semiconductor memory device is disclosed in Japanese Unexamined Patent Publication of Tokkai No. Hei 6-168,597, namely, JPA 6-168,597. According to JPA 6-168,597, the nonvolatile semiconductor memory device drives a word line with a variable voltage on read-out, write-in, and erasing operations. In the nonvolatile semiconductor memory device, on the write-in operation, a selected word line is supplied with a higher voltage than a power-supply voltage on the read-out operation. The word line is supplied with a negative voltage on the erasing operation.

Figure 2:
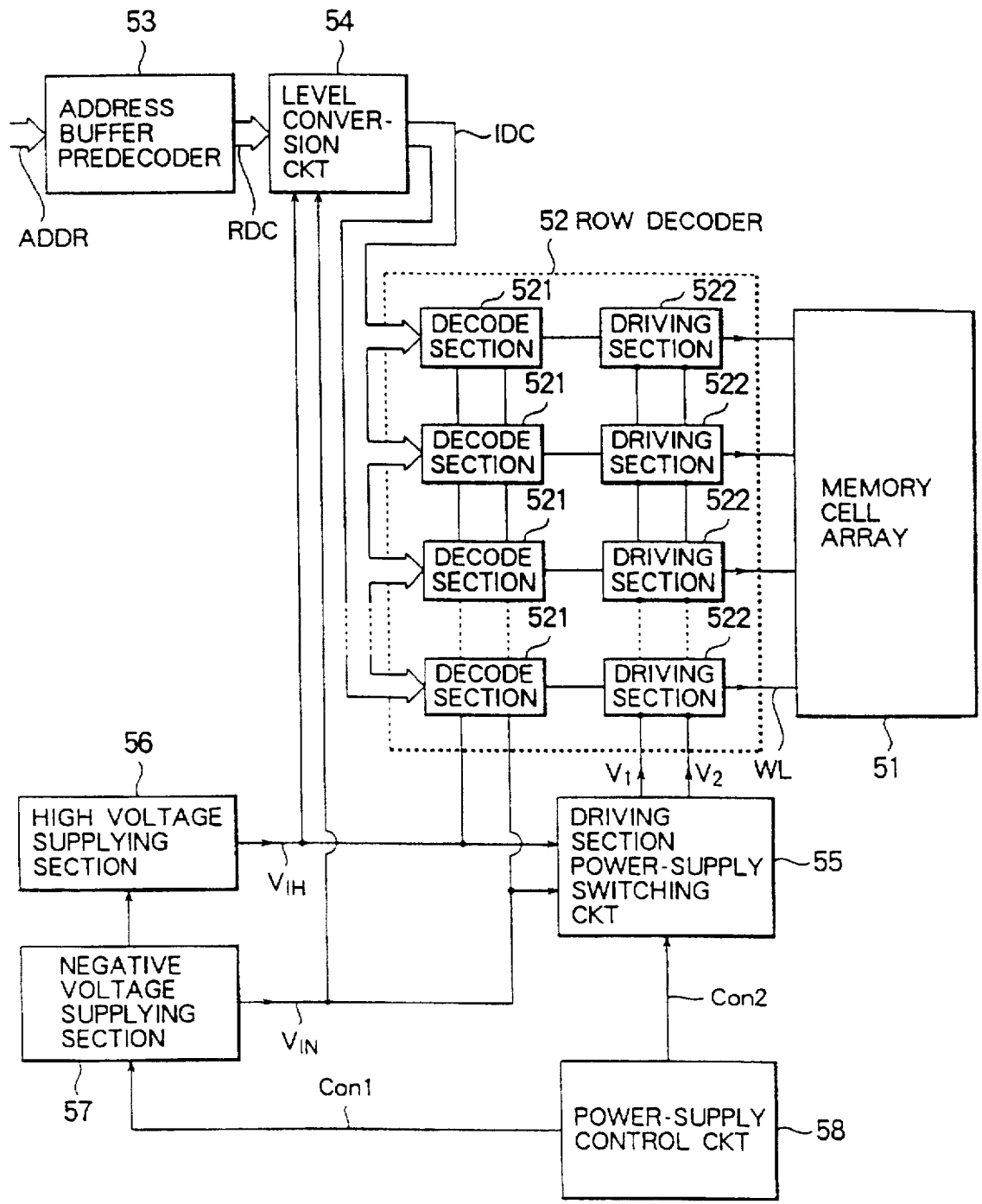
FIG. 2 is a schematic block diagram of another conventional nonvolatile semiconductor memory device.

FIG. 2 illustrates the nonvolatile semiconductor memory device according to JPA 6-168,597. The illustrated nonvolatile semiconductor memory device comprises a memory cell array 51, a row decoder 52, an address buffer predecoder 53, a level conversion circuit 54, a driving section power-supply switching circuit 55, a high voltage supplying section 56, a negative voltage supplying section 57, and a power-supply control circuit 58. The row decoder 52 comprises a plurality of decode sections 521 and a plurality of driving sections 522. The decode sections 521 are equal in number to word lines in the memory cell array 51. Likewise, the driving sections are equal in number to the word lines.

The address buffer predecoder 53 predecodes an address input signal ADDR to produce a row decoded signal RDC. The power-supply control circuit 58 produces first and second control signals Con1 and Con2. Under the control of the first control signal Con1, the high voltage supplying section 56 selectively supplies, as a high voltage $V_{IH}$, one of a positive potential ($V_{CC}$) and a high potential ($V_{PP}$). Under the control of the first control signal Con1, the negative voltage supplying section 57 selectively supplies, as a negative voltage $V_{IN}$, one of a zero potential ($V_{SS}$) and a negative potential ($V_{BB}$). The positive potential ($V_{CC}$), the high potential ($V_{PP}$) the zero potential ($V_{SS}$), and the negative potential ($V_{BB}$) are related to as follows:

$V_{BB} < V_{SS} < V_{CC} < V_{PP}$.

The high voltage $V_{IH}$ and the negative voltage $V_{IN}$ are supplied to the level conversion circuit 54, the decode sections 521, and the driving section power-supply switching circuit 55. The level conversion circuit 54 converts a level of the row decoded signal RDC into a plurality of level converted signals IDC. The level converted signals IDC are the decode sections 521. Each decode section 521 decodes the level converted signals IDC to access the memory cell array 51.

Under the control of the second control signal Con2, the driving section power-supply switching circuit 55 supplies first and second power-supply potentials $V_1$ and $V_2$ to the driving sections 522 in the row decoder 52. More specifically, the driving section power-supply switching circuit 55 produces, as the first and the second power-supply potentials $V_1$ and $V_2$, the positive potential ($V_{CC}$) and the zero potential ($V_{SS}$), respectively, on reading data out of the memory cell array 51. The driving section power-supply switching circuit 55 produces, as the first and the second power-supply potentials $V_1$ and $V_2$, the high potential ($V_{PP}$) and the zero potential ($V_{SS}$), respectively, on writing data in the memory cell array 51. The driving section power-supply switching circuit 55 produces, as the first and the second power-supply potentials $V_1$ and $V_2$, the negative potential ($V_{SS}$) and the positive potential ($V_{CC}$), respectively, on erasing data from the memory cell array 51. Responsive to a voltage level of an output of the decode section 521, each driving section 522 selectively produces one of the first power-supply potential $V_1$, a potential near to the first power-supply potential $V_1$, the second power-supply potential $V_2$, and a potential near to the second power-supply potential $V_2$.

With this structure, it is possible to supply the word lines WL with a desired voltage on the read-out, the write-in, and the erasing operations by changing power-supply voltages for the decode sections 521 and the driving sections 522 on the read-out, the write-in, and the erasing operations.

Figure 3:
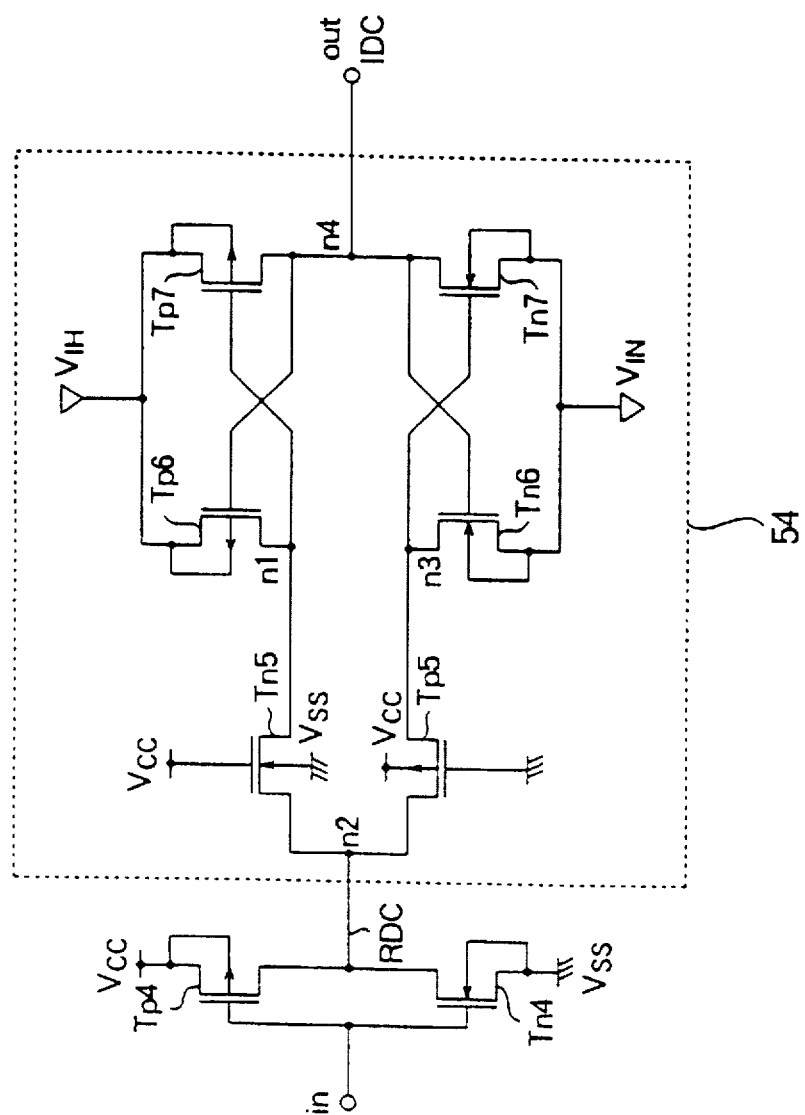
FIG. 3 is a circuit diagram of a level conversion circuit for use in the nonvolatile semiconductor memory device illustrated in FIG. 2.

Turning to FIG. 3, the level conversion circuit 54 converts the signal level of the row decoded signal RDC into a voltage signal corresponding to each operation. The level conversion circuit 54 comprises N-channel MOS transistors Tn5, Tn6, and Tn7 and P-channel MOS transistors Tp5, Tp6, and Tp7. The N-channel MOS transistor Tn6 serves as a pull-up transistor while the P-channel MOS transistor Tp6 serves as a pull-down transistor. The level conversion circuit 54 is called a level shifter. The level conversion circuit 54 is provided with a buffer circuit composed of an N-channel MOS transistor Tn4 and a P-channel MOS transistor Tp4 at a preceding stage thereof.

Figure 4:
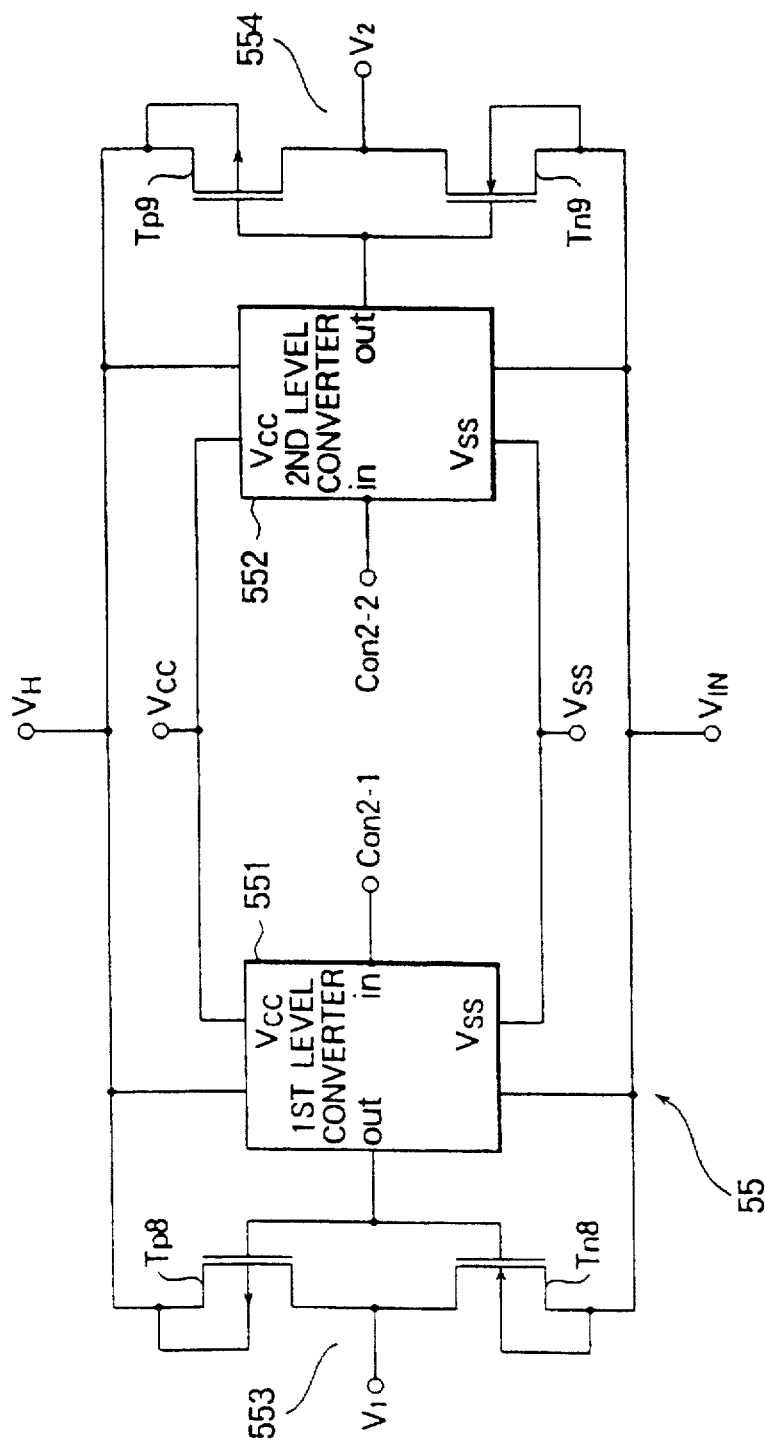
FIG. 4 is a block diagram of a driving section power-supply switching circuit for use in the nonvolatile semiconductor memory device illustrated in FIG. 2.

Turning to FIG. 4, in order to generate the negative voltage with switched on the erasing operation, the driving section power-supply switching circuit 55 comprises first and second level converters 551 and 552 and a first transistor circuit 553 composed two pair of N-channel and P-channel transistors Tn8 and Tp8 which are controlled by the first level converter 551, and a second transistor circuit 554 composed two pair of N-channel and P-channel transistors Tn9 and Tp9 which are controlled by the second level converter 552.

In the nonvolatile semiconductor memory device disclosed in JPA 6-168,597, not only voltages on the read-out and the erasing operations but also voltages supplied to a selected word line on the write-in operation are produced via the decode sections 521 and the driving sections 522. In general, it is necessary for the flash memory to inject electric charge into a floating gate in a selected cell on the write-in operation by supplying a selected word line with a high voltage which is two times or more of the main power-supply voltage $V_{DD}$ in an input/output section and a logic circuit section. Inasmuch as logic gates operable at the main power-supply voltage $V_{DD}$ are connected to address lines, it is necessary for the nonvolatile semiconductor memory device to be provided with the level shifter or the level converter for shifting or converting the level of the address input signal. This is because, on the write-in operation, the decode sections 521 and the driving sections 522 are operable at the voltage which is two times or more of the main power-supply voltage $V_{DD}$.

Generally, in the nonvolatile semiconductor memory device such as the flash memory, for each memory cell selected by one address, a write-in time interval for the write-in operation and an erasing time interval for the erasing operation are a prohibitively long time interval in comparison with a read-out time interval for the read-out operation. For example, the read-out time interval is a time interval between several nanoseconds and hundreds of nanoseconds. On the other hand, the write-in time interval is a time interval between several microseconds and hundreds of microseconds and the erasing time interval is a time interval between several milliseconds and hundreds of milliseconds. This reason is as follows. The read-out time interval is defined by a switching time interval for the transistor. On the other hand, injection and emission of the electric charges to and from the floating gate of the transistor are required for the write-in and the erasing operations and it results in taking a constant time interval. Accordingly, with respect to a time interval between a time instant where the address is determined and a time instant where the word line is selected by the decoder and driven, the read-out operation is required to operate at higher speed than that of the write-in and the erasing operations.

However, inasmuch as selection of the word line is made by selecting the address via the level shifter on the read-out operation as well as the write-in and the erasing operations in the nonvolatile semiconductor memory device according to JPA 6-168,597, a following problem occurs.

In general, the level shifter takes a longer time interval between a time instant where logic in input changes and a time instant where logic in output changes in comparison with a change time interval in a signal of a logic gate such as an inverter. For example, the inverter has a switching time interval of hundreds of picoseconds while the level shifer has a switching time interval of several nanoseconds. This reason is as follows. The level shifter illustrated in 3 includes the pull-up transistor Tp6 and the pull-down transistor Tn6. When logic in input changes in the pull-up and the pull-down transistors Tp6 and Tn6, collision occurs between logic change in the pull-up and the pull-down transistors Tp6 and Tp6 and logic in an input signal. As a result, a long time interval is taken by the time logic in output changes in a stable state after logic in input gets over the above-mentioned logic change. In addition, when input changes, an input current flows into the level shifter 54 due to collision of logic. Accordingly, it takes the buffer composed of the N-channel and the P-channel MOS transistors Tn4 and Tp4 a long time to change logic in output thereof. This results delay as long as the level shifter 54 intervenes although a voltage level of an input signal is identical with a voltage level of an output signal as an address decoder on the read-out operation. In addition, JPA 6-168,597 discloses various level shifters. Although any level shifter is used, delay in a signal occurs due to the level shifter. Furthermore, penetration current flows into any level shifter on changing of input.

In addition, in order to make nonvolatile semiconductor memory device mass storage and high speed, it is necessary to make a gate oxide film thinner with miniaturization process. The thinner the gate oxide film becomes, the lower a withstand voltage of an MOS transistor becomes.

Furthermore, it is necessary for the nonvolatile semiconductor memory device according to JPA 6-168,597 to supply the decode sections 521 with a high voltage as the power-supply voltage on the write-in operation of the memory cell array 51.

With these considerations, it is necessary to make the decode sections 521 high withstand voltage structure by making the gate oxide film thicker when the voltage on the write-in operation exceeds the withstand voltage of the MOS transistor. This results in making the decode sections 521 operate at a low speed.

On the other hand, in the flash memory of the type described, the memory cell with information put into a written state has a threshold voltage which is different from that of the memory cell with information put into an unwritten state. It is assumed that the flash memory comprises the memory cells put into the written state and the memory cells put into the unwritten state. In this event, it is assumed that the flash memory is erased by applying a constant negative voltage. Under the circumstances, the memory cells put into the written state have threshold voltages of negative values and become depletion states where the memory cells are put into ON states although gates of the memory cells are grounded. Such a phenomenon is called an overerased state. When the memory cells put into the overerased states are mingled with the flash memory, current flows even a nonselected state. As a result, it is difficult to exactly read information from the flash memory. In order to prevent occurrence of the overerased state, operation, which erases information from all memory cells after information is written in all memory cells, is carried out. However, such a operation is more complicated and takes more long time when the flash memory is integrated at higher density.

Figure 5:
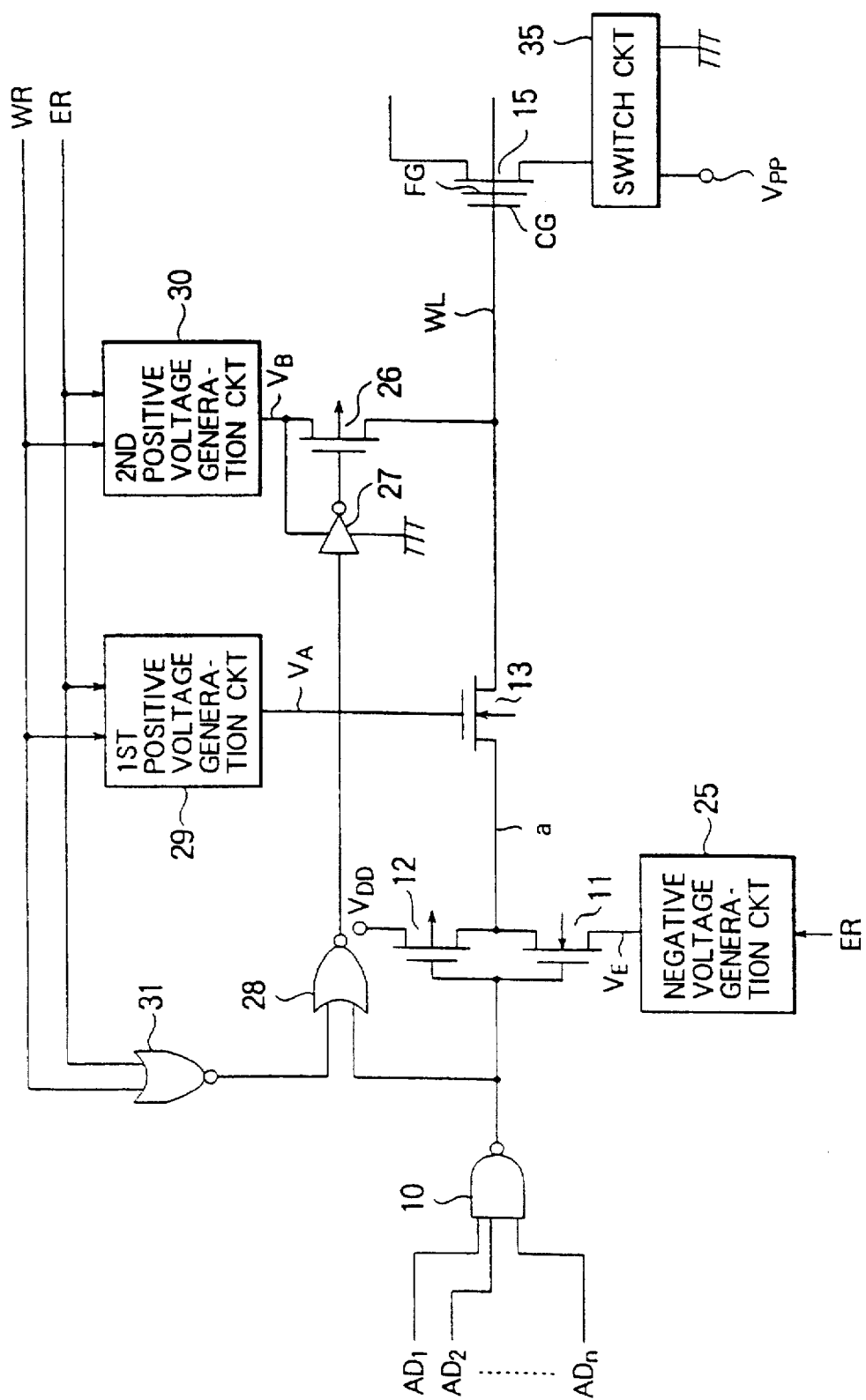
FIG. 5 is a schematic block diagram of a nonvolatile semiconductor memory device according to an embodiment of this invention.

Referring to FIG. 5, the description will proceed to a nonvolatile semiconductor memory device according to an embodiment of this invention. The illustrated nonvolatile semiconductor memory device is supplied with the first through the n-th address signals AD1 to ADn and the first and the second mode signals WR and ER in the similar manner that illustrated in FIG. 1. In addition, the illustrated nonvolatile semiconductor memory device comprises the row driving section (or, the address driving section) and the word line WR connected to the row driving section. The nonvolatile semiconductor memory device comprises a plurality of flash memory cells connected to the word line WL in a row direction along the word line WL. In FIG. 5, only single flash memory cell 13 is illustrated and represents the plurality of the flash memory cells. In addition, only a single word line WL is illustrated and represents a plurality of word lines.

In the manner which is similar to that illustrated in FIG. 1, the nonvolatile semiconductor memory device comprises the first and the second positive voltage generation circuit 29 and 30, the NOR gates 28 and 31, the inverter 27, and the P-channel transistor 26. The flash memory cell 15 has the source electrode which is selectively supplied with one of the subsidiary power-supply voltage $V_{PP}$ and the ground potential via the switch circuit 35.

Under the circumstances, each of the NAND gate 10, the NOR gate 28, and the NOR gate 31 has the positive power-supply terminal (not shown) supplied with the main power-supply voltage $V_{DD}$ and the negative power-supply terminal (not shown) supplied with the ground potential.

Each flash memory cell 15 illustrated in FIG. 5 has not only the drain region and the source region but also the floating gate electrode FG and the control gate electrode CG. In the manner which is similar to that illustrated FIG. 1, the nonvolatile semiconductor memory device comprises the N-channel transistor 13 between the word line WL and the row driving section. The nonvolatile semiconductor memory device is different from that illustrated in FIG. 1 that the P-channel transistor 14 is omitted and it is provided with the single negative voltage generation circuit 25. The negative voltage generation circuit 25 generates a negative voltage $V_E$. In addition, the first positive voltage generation circuit 29, the second positive voltage generation circuit 30, the negative voltage generation circuit 25, and the NOR gate 31 may be used to other circuits including other word lines (not shown) corresponding to different addresses. In this event, the first and the second positive voltages $V_A$ and $V_B$ the negative voltage $V_E$, and the output of the NOR gate 31 are connected to the other circuits including the other word lines.

More specifically, the negative voltage generation circuit 25 is connected to the source region of the N-channel transistor 11 composing the row driving section and is operable in response to the second mode signal ER. In the example being illustrated also, the row driving section comprises the N-channel transistor 11, the P-channel transistor 12 having the gate electrode connected to the gate electrode of the N-channel transistor 11, and the NAND gate 10 connected to the gate electrodes of both of the transistors 11 and 12. The NAND gate 10 is supplied with the first through the n-th address signals $AD_1$ to $AD_n$. In addition, the N-channel transistor 11 has the drain region connected to the drain region of the P-channel transistor 12 while the P-channel transistor 12 has the source region supplied with the main power-supply voltage $V_{DD}$ from the power supply (not shown).

It is assumed as follows. The main and the subsidiary power-supply voltages $V_{DD}$ and $V_{PP}$ are equal to 3.3 volts and 7.5 volts, respectively. The first positive voltage generation circuit 19 selectively generates, as the first positive voltage $V_A$, one of voltages of 3.3 volts and 2 volts at a time. The second positive voltage generation circuit 30 selectively generates, as the second positive voltage $V_B$, one of voltages of 3.3 volts and 7.5 volts at a time. In addition, the illustrated negative voltage generation circuit 25 selectively generates, as the negative voltage $V_E$, one of voltages of zero volt and −0.5 volts at a time. With regard to this, as the flash memory cell 15 is used one which can be erased by applying of the above-mentioned negative voltage $V_E$ in the manner which will later be described.

Description will proceed to read-out, write-in, and erasing operations in the nonvolatile semiconductor memory illustrated in FIG. 1.

It is assumed that the word line W1 of the flash memory cell 15 is not selected. In this event, at least one of the first through the n-th address signals $AD_1$ to $AD_n$ takes the logic "0" and then the NAND gate 10 produces the output of the logic "1". As a result, the point a on the word line WL has the low potential or the zero potential and the read-out and the write-in operations for the flash memory cell 15 is not carried out.

On the other hand, when the flash memory cell 15 is selected, all of the first through the n-th address signals $AD_1$ to $AD_n$ have the logic "1" and then the point a on the word line WL is supplied with the main power-supply voltage $V_{DD}$.

Description will be made as regards the read-out operation of the nonvolatile semiconductor memory illustrated in FIG. 5 in a case where the word line WL is put into the selected state. In this event, signals of logic "0" are supplied as the first mode signal WR and the second mode signal ER in the manner which is similar to that illustrated in FIG. 1. As a result, the first and the second positive voltage generation circuits 29 and 30 generate, as the first and the second positive voltages $V_A$ and $V_B$, the voltage of 3.3 volts that is equal to the main power-supply voltage $V_{DD}$. On the other hand, the negative voltage generation circuit 25 generates, in response to the second mode signal ER of the logic "0", the negative voltage $V_E$ of zero volt and the source electrode of the flash memory cell 15 is grounded via the switch circuit 35.

Under the circumstances, the N-channel transistor 13 inserted in the word line WL is turned on while the P-channel transistor 26 connected to the second positive voltage generation circuit 30 is turned off. As a result, the word line WL is charged up to the main power-supply voltage $V_{DD}$ of 3.3 volts, the control gate electrode CG of the flash memory cell 15 is supplied with the voltage of 3.3 volts, and then the read-out operation of the flash memory cell 15 is possible. In order to charge the selected word line WL up to the main power-supply voltage $V_{DD}$ at a high speed, it is desirable that the N-channel transistor 13 has a threshold voltage $V_T$ between −0.5 volts and 0.1 volts. This reason is to avoid that the voltage on the word line WL is lower by the threshold voltage VT of N-channel transistor 13 as possible.

On the other hand, in a case of the write-in operation, the signal of logic "1" is supplied as the first mode signal WR and the signal of logic "0" is supplied as the second mode signal ER. In this event, the first positive voltage generation circuit 29 generates, as the first positive voltage $V_A$, the voltage of 2 volts and the second positive voltage generation circuit 30 generates, as the second positive voltage $V_B$, the voltage of 7.5 volts that is equal to the subsidiary power-supply voltage $V_{PP}$. In addition, the source electrode of the flash memory cell 15 is grounded.

Under the circumstances, the N-channel transistor 13 is turned off and the P-channel transistor 26 is turned on. As a result, the word line WL is supplied with the voltage of 7.5 volts that is equal to the subsidiary power-supply voltage $V_{PP}$. the voltage of 7.5 volts is supplied with the control gate electrode of the flash memory cell 15, and then the flash memory cell 15 becomes a state enable to carry out the write-in operation.

In this event, the N-channel transistor 13 can be turned off with no problem although the N-channel transistor is a depletion transistor having the threshold voltage VT of, for example, −0.5 volts. This is because the N-channel transistor has a gate voltage of 2 volts and drain and source voltages of 7.5 volts and 3.3 volts, and the gate voltage is sufficiently lower than the drain and the source voltages.

Inasmuch as the NOR gate 28 produces the high level output voltage of 3.3 volts and the inverter 27 has the power-supply voltage of 7.5 volts, the inverter 27 is supplied with an intermediate potential. If transistors composing the inverter 27 are designed in size so that the ability of an N-channel transistor of the inverter 27 to drive current is sufficiently larger than the ability of a P-channel transistor thereof to drive current, the inverter 27 produces the voltage near to zero volt and then it is possible to put the P-channel transistor 26 into ON state. In this event, although a penetration current flows into the inverter 27, there is no problem. This is because the penetration current is sufficiently smaller than a current which flows into the flash memory cell 15 on the write-in operation. The penetration current flows into the inverter 27 only at this moment.

Description will be made as regards the erasing operation of the nonvolatile semiconductor memory illustrated in FIG. 5. In this event, the source electrode of the flash memory cell 15 is supplied with the subsidiary power-supply voltage $V_{PP}$ via the switch circuit 35 and the drain electrode of the flash memory cell 15 is put into an open state. It is assumed herein that a low voltage of about 7.5 volts is supplied to the source electrode of the flash memory cell 15.

In addition, in the example being illustrated, it is also assumed that the erasing operation is carried out with the first through the n-th address signals $AD_1$ to $AD_n$ at least one thereof which takes the logic "0" supplied. As a result, the N-channel transistor 11 is put into ON state on the erasing operation.

Furthermore, on the erasing operation, the signals of logic "0" and "1" are supplied as the first and the second mode signals WR and ER, respectively, and the first and the second positive voltage generation circuits 29 and 30 generate, as the first and the second positive voltages $V_A$ and $V_B$, the voltage of 3.3 volts that is equal to the main power-supply voltage $V_{DD}$. As a result, the N-channel transistor 13 becomes ON state while the P-channel transistor 26 becomes OFF state.

On the other hand, responsive to the second mode signal ER of the logic "1", the negative voltage generation circuit 25 generates the negative voltage $V_E$ of −0.5 volts in place of zero volt. The negative voltage $V_E$ is supplied to the control gate electrode of the flash memory cell 15 via the N-channel transistors 11 and 13, and the word line WL.

Figure 6:
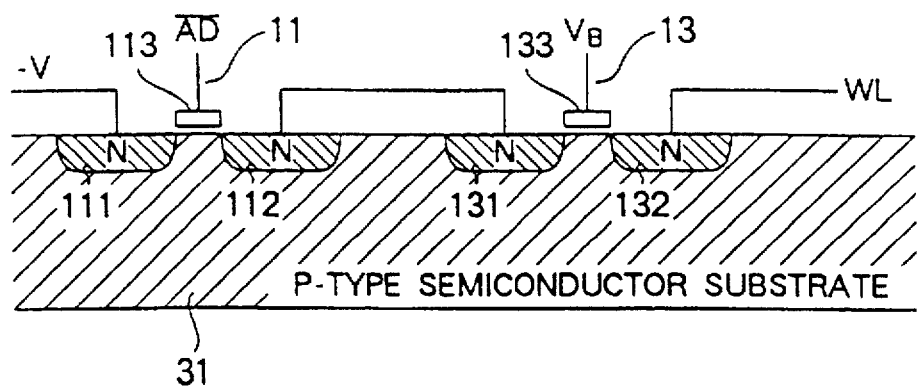
FIG. 6 is a cross-sectional view of N-channel transistors for use in the nonvolatile semiconductor memory device illustrated in FIG. 5.

Referring to FIG. 6 in addition to FIG. 5, the description will be made as regards states of the N-channel transistors 11 and 13 in a case where the negative voltage of −0.5 volts is supplied from the negative voltage generation circuit 25 connected to the row driving section in the manner which is described above. FIG. 6 shows schematic structure and an electrical connection relationship between the two N-channel transistors 11 and 13 in order to simplify drawing. As illustrated in FIG. 6, a P-type semiconductor substrate 31 has a main surface on which the N-channel transistors 11 and 13 are formed.

More specifically, the illustrated N-channel transistor 11 comprises source and drain regions 111 and 112 which are formed by diffusing N-type impurities. A channel region is formed between the both regions 111 and 112. In addition, a gate electrode 113 is formed on the channel region via a gate insulating film (not shown).

On the other hand, the N-channel transistor 13 comprises source and drain regions 131 and 132 which are formed by diffusing N-type impurities. Formed between the regions 131 and 132 is a channel region on which a gate electrode 133 is formed via a gate insulating film (not shown).

It is assumed that the N-channel transistor 11 is put into ON state and the N-channel transistor 13 is also put into ON state in FIG. 6. In this state, it is assumed that the source region 111 of the N-channel transistor 11 is supplied with the negative voltage (−V). When the negative voltage (−V) is high, the N-channel transistor 11 is biased in a forward direction between the source region 111 and the P-type semiconductor substrate 31. As a result, a forward current flows between the source region 111 and the P-type semiconductor substrate 31.

Inasmuch as the negative voltage (−V) is the low voltage of about −0.5 volts, the negative voltage (−V) cannot exceed cutoff regions in a forward characteristic of p-n junctions (i.e. diodes) in the N-channel transistors 11 and 13. In this event, it is possible to supply the negative voltage to the word line WL via the N-channel transistor 13 by supplying the negative voltage (−V) to the source region 111 of the N-channel transistor As described above, when the low negative voltage is generated by the negative voltage generation circuit 25 connected to the row driving section, the low negative voltage (−V) is supplied to the control gate electrode CG of the flash memory cell 15 via the word line WL.

On the other hand, inasmuch as the source electrode of the flash memory cell 15 is supplied with the low subsidiary power-supply voltage $V_{PP}$ of 7.5 volts, a voltage difference between the control gate electrode CG and the source electrode in the flash memory cell 15 becomes 8 volts. As a result, if as the flash memory cell 15 is used the memory cell having the erasable voltage (which can erase stored contents from the flash memory cell) of 8 volts between the control gate electrode VG and the source electrode, the stored contents of the flash memory cell 15 can be erased by applying the low negative voltage.

As described above, the nonvolatile semiconductor memory device illustrated in FIGS. 5 and 6 can erase the stored contents from the flash memory cell 15 by connecting the negative voltage generation circuit 25 with the row driving section (the address driving section) to supply the word line WL with the low negative voltage without use of the complicated circuit illustrated in FIG. 1. As a result, it is possible to supply the negative voltage to the word line with a small-scale circuit. In addition, the nonvolatile semiconductor memory device according this embodiment is advantageous in that the row driving circuit is used also as the erasing circuit for erasing information from the memory cell.

In the manner which is described above, inasmuch as the negative voltage can be supplied to the control gate electrode CG of the flash memory cell 15 on the erasing operation, it is possible to make the threshold value in the flash memory cell 15 after the erasing operation the similar value in a case where the main and subsidiary power-supply voltages $V_{DD}$ and $V_{PP}$ are equal to 5 volts and 8 volts, respectively, although the subsidiary power-supply voltage $V_{PP}$ to be supplied to the source electrode of the flash memory cell 15 is the low voltage. Although the description in the above-mentioned embodiment is made as regards the case where the negative voltage $V_E$ is equal to the voltage of −0/5 volts, the negative voltage $V_E$ may be the voltage of a range between zero volts to −0.6 volts. If the negative voltage $V_E$ has the above-mentioned range, it is unnecessary to insert the level shifter between the NAND gate 10 and the P-channel and the N-channel MOS transistors 12 and 11.

Figure 7:
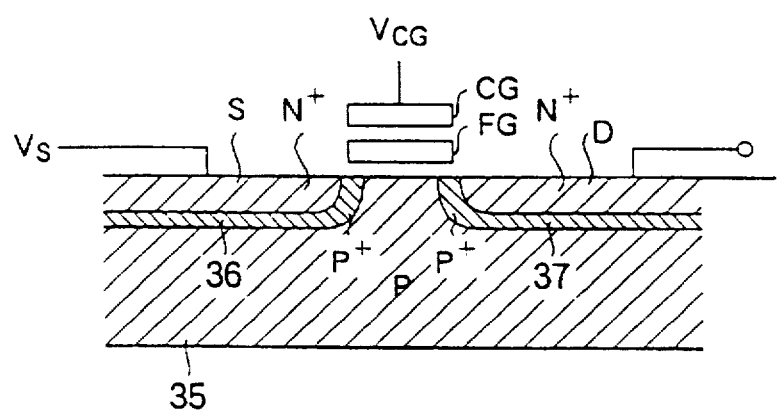
FIG. 7 is a cross-sectional view of a flash memory cell use in the nonvolatile semiconductor memory device illustrated in FIG. 5.

Referring to FIG. 7, the description will proceed to the flash memory cell 15 which can erase the stored contents by applying the above-mentioned low negative voltage. The illustrated flash memory cell 15 comprises a P-type substrate 35, and a source region S and a drain region D which are formed on the P-type substrate 35 by diffused layers of $N^+$-type impurities. The source and the drain regions S and D are enclosed with P-type regions 36 and 37, respectively, which are formed by diffusing $P^+$-type impurities. In addition, on a channel region between the source and the drain regions S and D, the floating gate electrode FG is formed via a gate insulating film (not shown). On the floating gate electrode FG, the control gate electrode CG is formed via an insulating film (not shown). The flash memory cell of the-type described has a structure where the source and the drain regions S and D are identical with each other and the stored contents therein can be erased by making the drain region D open, by supplying the source region S with the voltage of, for example, 8 volts, and by supplying the control gate electrode CG with the voltage of about zero volt. In other words, this means that it is possible to erase the stored contents from the flash memory cell 15 by making the voltage difference between the control gate electrode VG and the source region S about 8 volts.

Accordingly, the stored contents of the flash memory cell 15 can be erased by supplying the control gate electrode CG with −0.5 volts even though the voltage to be supplied to the source region S is reduced to about 7.5 volts.

Figure 8:
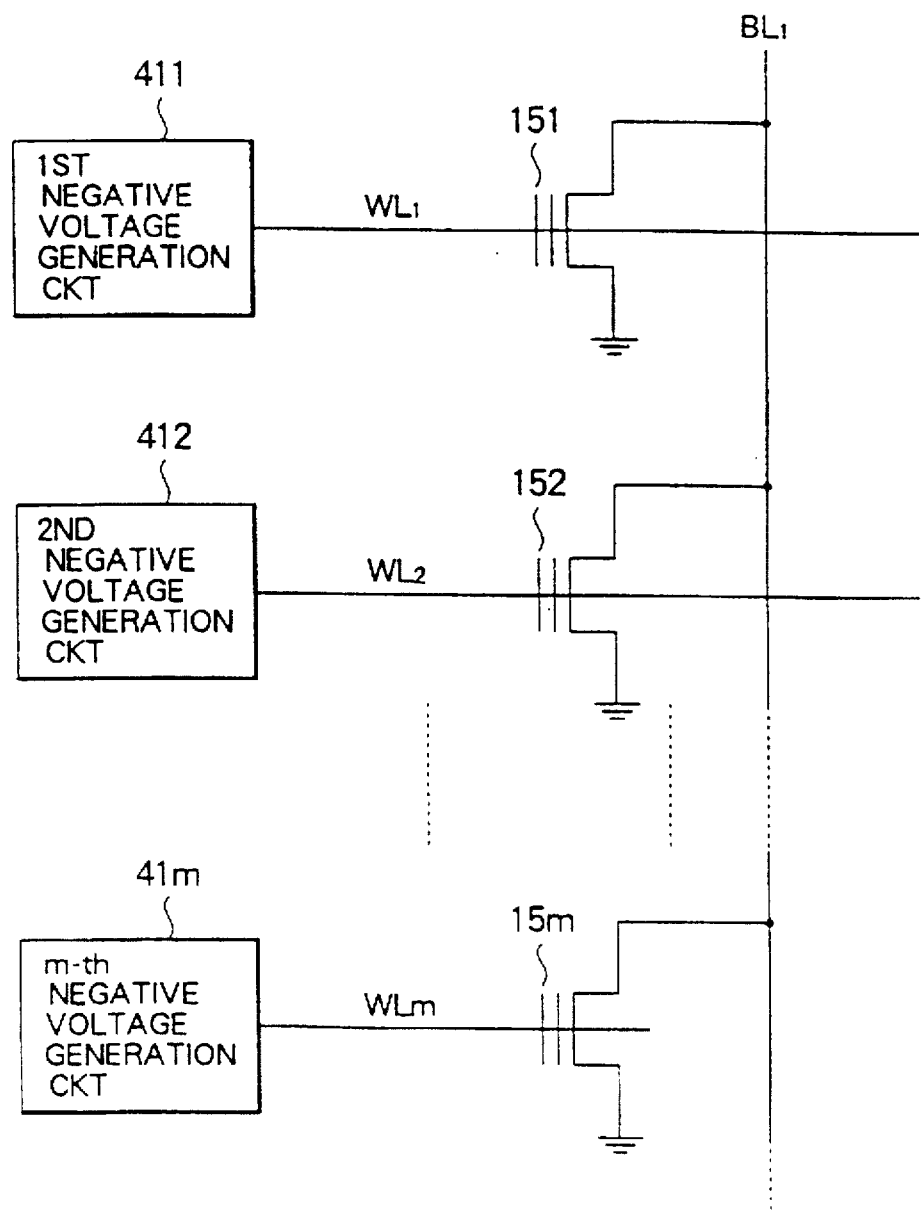
FIG. 8 is a schematic block diagram of a nonvolatile semiconductor memory device according to another embodiment of this invention.

Referring to FIG. 8, the description will proceed to a nonvolatile semiconductor memory device according to another embodiment of this invention. It is herein assumed that a bit line $BL_1$ is connected to first through m-th flash memory cells 151, 152, ..., and 15 m in a column direction where m represents an integer which is not less than two. In addition, it is also assumed that any of the first through the m-th flash memory cells 151 to 15 m have abnormal threshold values $V_T$ of, for example, −0.3 volts caused by overerase or problems on fabrication of the nonvolatile semiconductor memory device while remaining flash memory cells have normal threshold values of, for example, zero volt. Under the circumstances, when selection is made the flash memory cell having the normal threshold value, current flows into not only the flash memory cell having the normal threshold value but also the flash memory cells each having the abnormal threshold value. As a result, it is substantially impossible to read information.

Under the circumstances, if the first through the m-th flash memory cells 151 to 15 m are connected to first through m-th negative voltage generation circuits 411, 412, ..., and 41m, respectively, each of which can supply the voltage less than variation in the threshold values, for example, the voltage of −0.5 volts on nonselecting operation, information can be read out of the flash memory cell having the normal threshold value. This is because no current flows into the flash memory cells having the abnormal threshold value when one of the flash memory cells having the normal threshold value is selected.

This means that it is possible to improve the rate of non-defective product in the flash memory cells or the nonvolatile semiconductor memory devices by employing a structure so that the negative voltage lower than the range of variation of the threshold values is supplied on the nonselecting operation although there is variation in the threshold values of the flash memory cells in manufacturing processes. In addition, although overerasing occurs on the erasing operation of the stored contents from the flash memory cells, it is possible to remove a readout disable state caused by variation of the threshold value due to the overerasing by employing a structure so that the negative voltage is supplied from the negative voltage generation circuit.

What is claimed is:

1. A nonvolatile semiconductor memory device comprising: an address driving section comprising an N-channel transistor and a P-channel transistor, said address driving section producing a level signal corresponding to an address decoded signal; and a memory cell having a control gate, said memory cell erasing stored contents therefrom by supplying the control gate with a predetermined voltage, wherein said nonvolatile semiconductor memory device comprises:

means, on writing data in said memory cell, for supplying the control gate of said memory cell with a higher voltage than an output voltage of said address driving section in place of the output voltage of said address driving section; and a negative voltage generation circuit, on erasing the stored contents, for supplying a negative voltage to a source of said N-channel transistor to supply the negative voltage to the control gate of said memory cell via said N-channel transistor, thereby erasing the stored contents from said memory cell.

2. A nonvolatile semiconductor memory device as claimed in claim 1, wherein said N-channel transistor comprises a P-type semiconductor substrate and N-type regions which are formed in the P-type semiconductor substrate and which form the source and a drain of said N-channel transistor, said negative voltage generation circuit generating, as the negative voltage, a voltage defined by a forward voltage between said N-type regions and said P-type semiconductor substrate.

3. A nonvolatile semiconductor memory device as claimed in claim 1, wherein the negative voltage is laid in a range between zero volt and −0.6 volts.

4. A nonvolatile semiconductor memory device as claimed in claim 1, wherein said negative voltage generation circuit is supplied with a mode signal indicative of one of a write-in/read-out mode and an erasing mode, said negative voltage generation circuit generating the negative voltage only when the mode signal indicates the erasing mode.

5. A nonvolatile semiconductor memory device as claimed in claim 1, wherein the N-channel transistor in said address driving section has the source connected to said negative voltage generation circuit, a drain, and a gate, the P-channel transistor in said address driving section having a gate connected to the gate of the N-channel transistor, a drain connected to the drain of the N-channel transistor in common, and a source supplied with a power-supply voltage.

6. A nonvolatile semiconductor memory device as claimed in claim 5, further comprising another N-channel transistor which is connected between a common connection node of the drains of the N-channel and the P-channel transistors and the control gate of said memory cell.

7. A nonvolatile semiconductor memory device comprising: an address driving section comprising transistors having channels which are different from each other; and a memory cell having a control gate, said memory cell erasing stored contents therefrom by supplying the control gate with a predetermined voltage, wherein said nonvolatile semiconductor memory device comprises a voltage generation circuit, on erasing stored contents from said memory cell, for supplying a forward voltage to a part of p-n junction included in one of the transistors in said address driving section.

8. A nonvolatile semiconductor memory device as claimed in claim 1, wherein said memory cell comprises the control gate, a floating gate, source and drain regions formed in a semiconductor substrate of a first conductivity type, each of said source and said drain regions having a first region doped with impurities which have the first conductivity type and concentration higher than that of said semiconductor substrate and, each of said source and drain regions further having a second region doped with impurities of a second conductivity type different from the first conductivity type, said second region being formed in said first region.

9. A nonvolatile semiconductor memory device comprising: an address driving section comprising a single N-channel transistor and a single P-channel transistor having a drain connected to a drain of said N-channel transistor, said address driving section producing a level signal corresponding to an address decoded signal from a common connection node of said both transistors; and a memory cell having a control gate, said memory cell erasing stored contents therefrom by supplying the control gate with a predetermined voltage, wherein said nonvolatile semiconductor memory device comprises a negative voltage generation circuit, on erasing the stored contents, for supplying a negative voltage to a source of said N-channel transistor to supply the negative voltage to the control gate of said memory cell via said N-channel transistor, thereby erasing the stored contents from said memory cell.

* * * * *